United States Patent
Qian

(10) Patent No.: US 9,383,480 B2
(45) Date of Patent: Jul. 5, 2016

(54) PHOTOCURABLE ACRYLATE COMPOSITION

(71) Applicant: CHANGZHOU TRONLY ADVANCED ELECTRONIC MATERIALS CO., LTD., Changzhou, Jiangsu (CN)

(72) Inventor: Xiaochun Qian, Jiangsu (CN)

(73) Assignee: CHANGZHOU TRONLY ADVANCED ELECTRONIC MATERIALS CO., LTD., Changzhou (CN)

(*) Notice: Subject to any disclaimer, the term of this patent is extended or adjusted under 35 U.S.C. 154(b) by 0 days.

(21) Appl. No.: 14/780,274

(22) PCT Filed: Jan. 26, 2014

(86) PCT No.: PCT/CN2014/071443
§ 371 (c)(1),
(2) Date: Sep. 25, 2015

(87) PCT Pub. No.: WO2014/187170
PCT Pub. Date: Nov. 27, 2014

(65) Prior Publication Data
US 2016/0047945 A1    Feb. 18, 2016

(30) Foreign Application Priority Data

May 20, 2013 (CN) .......................... 2013 1 0187435

(51) Int. Cl.
| | |
|---|---|
| C08F 2/46 | (2006.01) |
| C08F 2/50 | (2006.01) |
| C08G 61/04 | (2006.01) |
| G02B 1/04 | (2006.01) |
| G02B 1/10 | (2015.01) |
| G03F 7/00 | (2006.01) |
| G03F 7/031 | (2006.01) |
| G03F 7/033 | (2006.01) |
| G02F 1/1339 | (2006.01) |
| G02F 1/1335 | (2006.01) |

(52) U.S. Cl.
CPC G02B 1/04 (2013.01); G02B 1/105 (2013.01); G02F 1/13392 (2013.01); G02F 1/133514 (2013.01); G03F 7/0007 (2013.01); G03F 7/031 (2013.01); G03F 7/033 (2013.01); *G02F 1/133516* (2013.01); *G02F 2001/13398* (2013.01); *G02F 2202/023* (2013.01)

(58) Field of Classification Search
CPC .... G02B 1/04; G02F 1/33514; G02F 1/13392
USPC ............ 522/34, 33, 6, 1, 71, 189, 184; 520/1
See application file for complete search history.

(56) References Cited

U.S. PATENT DOCUMENTS

| | | | |
|---|---|---|---|
| 2003/0036006 A1 | 2/2003 | Feke et al. | |
| 2009/0027608 A1* | 1/2009 | Nakamura | G03F 7/0388 349/155 |

FOREIGN PATENT DOCUMENTS

| | | | |
|---|---|---|---|
| CN | 101354532 A | | 1/2009 |
| CN | 101891845 | * | 11/2010 |
| CN | 101923287 | * | 12/2010 |
| CN | 101923287 A | | 12/2010 |
| CN | 102492060 A | | 6/2012 |
| CN | 102778814 | * | 11/2012 |
| CN | 102778814 A | | 11/2012 |
| CN | 103293855 A | | 9/2013 |
| JP | 2002-256565 A | | 9/2000 |
| JP | 2010-184880 A | | 8/2010 |

OTHER PUBLICATIONS

Qian et al, CN 101891845 Machine Translation, Nov. 24, 2010.*
Qian et al, CN101923287 Machine Translation, Dec. 22, 2010.*
Qian et al, CN 102778814 Machine Translation, Nov. 14, 2012.*
Chinese Office Action, dated Sep. 23, 2014, for Chinese Application No. 201310187435.7, 11 pages. (with English Translation).
International Search Report, mailed May 20, 2014, for International Application No. PCT/CN2014/071443, 6 pages.
Written Opinion, mailed May 20, 2014, for International Application No. PCT/CN2014/071443, 8 pages. (with Partial English Translation).

* cited by examiner

*Primary Examiner* — Ling Choi
*Assistant Examiner* — Jessica E Whiteley
(74) *Attorney, Agent, or Firm* — Seed IP Law Group PLLC

(57) ABSTRACT

A photocurable acrylate composition, containing a compound of formula (I) as a photoinitiator and the components adapted to the photoinitiator. The photocurable composition has very good storage stability and very high light sensitivity, can be cross-linked and cured at a very low exposure dose, and has a very good curing effect; a film made from the composition has a smooth edge, no defect and scum, and good integrity throughout the whole pattern, and is a high-hardness resist film, and an optical filter made therefrom has high optical transparency and no light leakage.

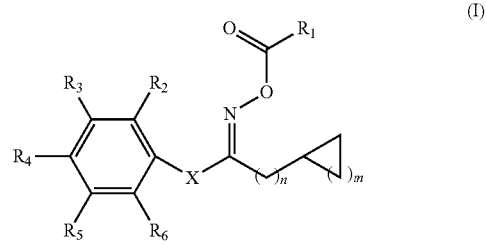

8 Claims, No Drawings

PHOTOCURABLE ACRYLATE COMPOSITION

FIELD OF THE DISCLOSURE

This present disclosure belongs to the field of the photocuring technology, and specifically relates to a photocurable acrylate composition and its application in liquid crystal display apparatuses such as a color filter and a photospacer.

BACKGROUND OF THE DISCLOSURE

As a key member in a liquid crystal display apparatus, a color filter consists of various pixel materials such as red (R), green (G), blue (B), black, and the like, wherein the black is made to be matrix-like to separate R, G, and B to prevent cross-color (i.e., a black matrix, BM). In a liquid crystal display, in order to maintain the thickness between a color filter substrate and a thin-film transistor, spherical particles made of glass or resin referred to as spacers (photospacers) are dispersed inside a box.

Photocurable acrylate compositions have been widely used for preparing RGBs, BMs, and photospacers. At present, related reports have been made by a number of patent documents, such as CN1337013, CN1424624, CN101052918, CN101118382, CN101025568, and the like. However, the development of the micro-electronic technology and the demand of environmental protection propose higher requirements for the properties of photocurable acrylate compositions. It is practically demonstrated that conventional acrylate compositions generally have drawbacks such as poor solubility, low thermal stability, low photosensing activity, etc., and are incompletely photocurable, resulting in high defective rate of liquid crystal panels, high pollution of production streamline, and increased production cost. These factors do not allow them to meet the needs of industry development.

In view of the above, this present disclosure discloses a photocurable acrylate composition with a novel oxime ester photoinitiator introduced, wherein the photoinitiator, the selected acrylate monomer and the polymer component have very excellent adaptability, exhibiting excellent application performance.

SUMMARY OF THE DISCLOSURE

With respect to the deficiencies in prior art, an object of this present disclosure is to provide a photocurable acrylate composition, containing a compound of formula (I) as a photoinitiator and components of an acrylate monomer and a polymer adapted to the photoinitiator. Upon photopolymerization, this photocurable composition has high curing speed, low pollution, low energy consumption, high exposure efficiency, small exposure dose, fine and integral of image patterns cure-molded, no defect and scum, and and good film hardness.

In order to achieve the technical effects described above, this present disclosure employs the following technical solutions:

A photocurable acrylate composition, comprising the following components of:

(A) 20-45 parts by mass of a polymer having a carboxylic acid group at a side chain, which is selected from at least one of a (meth)acrylic acid copolymer, an itaconic acid copolymer, a crotonic acid copolymer, and a partially esterified maleic acid copolymer, and the weight average molecular weight (Mw) of said polymer is 5000-250000;

(B) 10-30 parts by mass of a polyfunctional acrylate monomer;

(C) 2-7 parts by mass of a photoinitiator, which is selected from oxime ester compounds represented by formula (I);

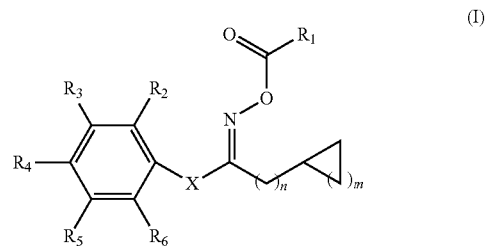

wherein, $n=1-10$, $m=1-8$;

X is a linking bond, a carbonyl group (—C=O), or an alkenyl group (—C=CH$_2$);

R$_1$ is selected from R$_{11}$, OR$_{11}$, COR$_{11}$, CONR$_{12}$R$_{13}$ or CN, wherein R$_{11}$, R$_{12}$ and R$_{13}$ are each independently selected from hydrogen, a C$_{1-20}$ alkyl or cycloalkyl group, a C$_{6-20}$ aryl group, a C$_{7-20}$ aralkyl group or a C$_{2-20}$ heterocyclic group;

R$_2$, R$_3$, R$_4$, R$_5$ and R$_6$ each independently represent a hydrogen atom, a halogen atom, or an optionally substituted C$_{1-12}$ alkyl group, C$_{1-12}$ alkoxy group, C$_{5-8}$ cycloalkyl group, C$_{6-20}$ phenyl group, C$_{7-20}$ benzyl group, C$_{7-20}$ benzoyl group, C$_{2-12}$ alkanoyl group, C$_{1-20}$ heteroaroyl group, C$_{3-20}$ alkoxycarbonyl alkanoyl group, C$_{8-20}$ phenoxycarbonyl alkanoyl group, C$_{3-20}$ heteroaryloxycarbonyl alkanoyl group, C$_{2-12}$ alkoxycarbonyl or phenoxycarbonyl group, or —OR$_7$,—SR$_8$,—SOR$_8$,—SO$_2$R$_8$ or —NR$_9$R$_{10}$, provided that at least one of R$_2$, R$_3$, R$_4$, R$_5$ and R$_6$ is selected from —OR$_7$, —SR$_8$ or —NR$_9$R$_{10}$, wherein R$_7$ represents a hydrogen atom or an optionally substituted C$_{1-12}$ alkyl group, C$_{2-8}$ alkanoyl group, C$_{3-12}$ alkenyl group, C$_{3-30}$ alkenoyl group, C$_{6-20}$ phenyl group, —(CH$_2$CH$_2$O)$_z$H (z is an integer of 1-2020) or C$_{3-15}$ trialkyl silyl group, R$_8$ represents a hydrogen atom or an optionally substituted C$_{1-12}$ alkyl group, C$_{2-8}$ alkanoyl group, C$_{3-12}$ alkenyl group, C$_{6-20}$ phenyl group, a C$_{3-15}$ trialkyl silyl group, and R$_9$ and R$_{10}$ each independently represent a hydrogen atom or an optionally substituted C$_{1-12}$ alkyl group, C$_{2-4}$ hydroxyalkyl group, C$_{3-5}$ alkenyl group or C$_{6-20}$ phenyl group;

optionally, R$_2$R$_3$, R$_4$, R$_5$ and R$_6$ may be bonded to each other to form a cyclic structure; and optionally, each of R$_2$, R$_3$, R$_4$, R$_5$ and R$_6$ may be bonded to R$_1$ to form a cyclic structure.

In the photocurable acrylate composition described above, the photoinitiator of component (C) is preferably one or a combination of two or more of the following structures:

Compound No.1
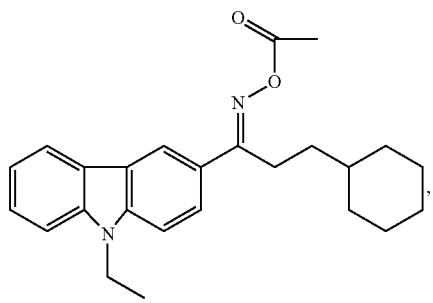
Compound No.2
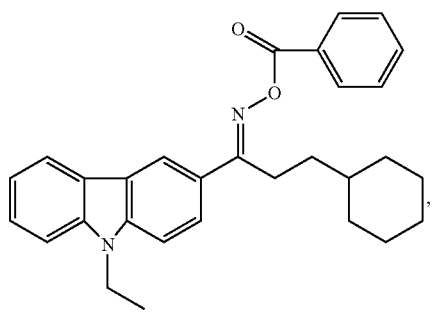
Compound No.3
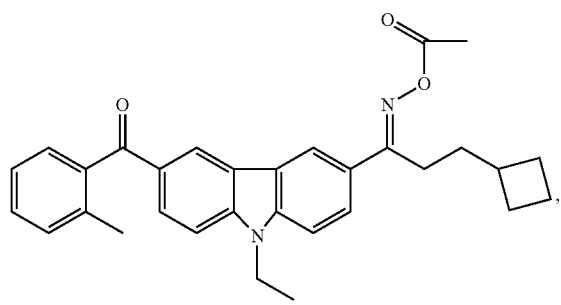
Compound No.4
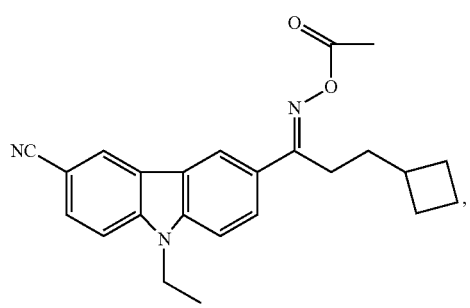
Compound No.5
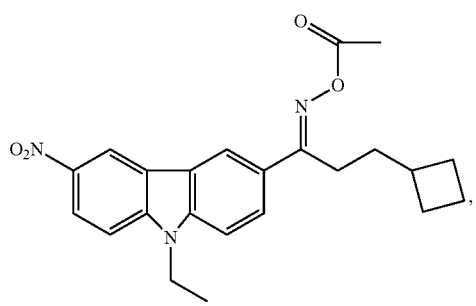
-continued
Compound No.6
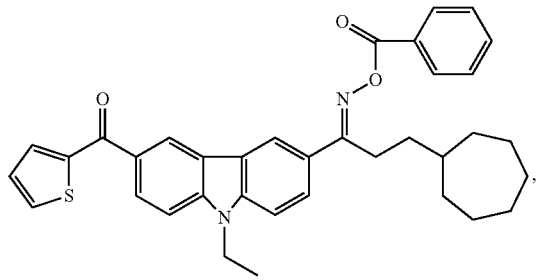
Compound No.7
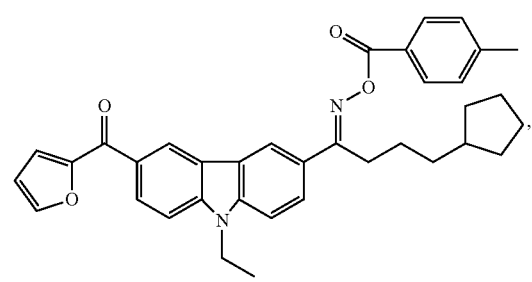
Compound No.8
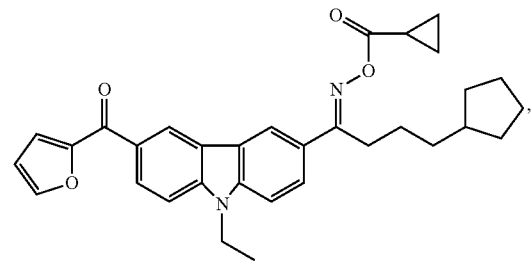
Compound No.9
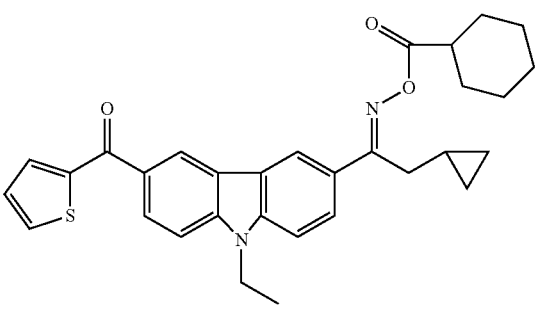
Compound No.10
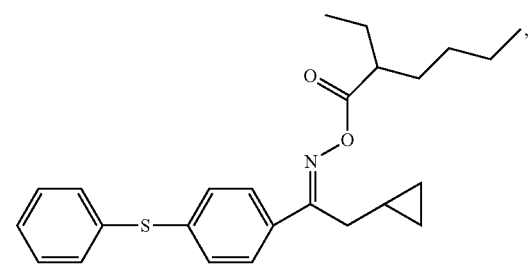

Compound No.11
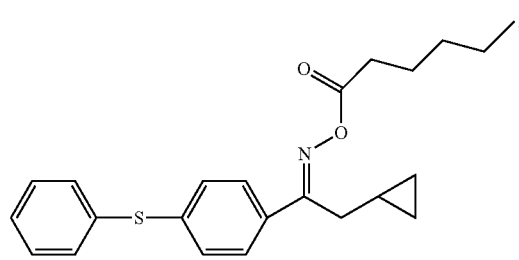
Compound No.12
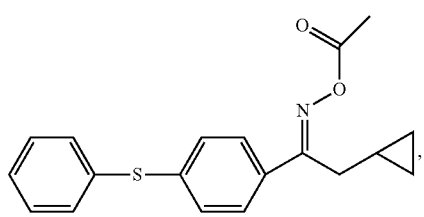
Compound No.13
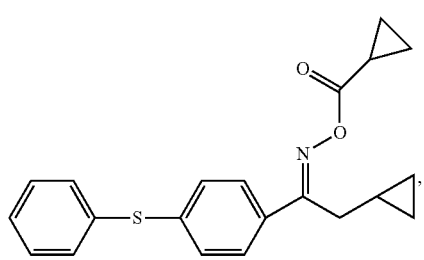
Compound No.14
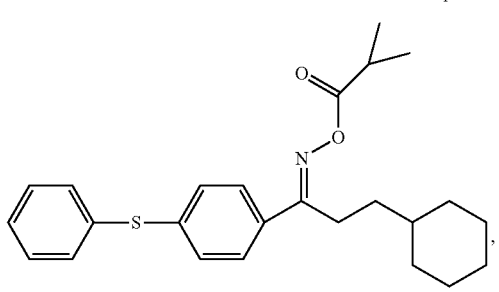
Compound No.15
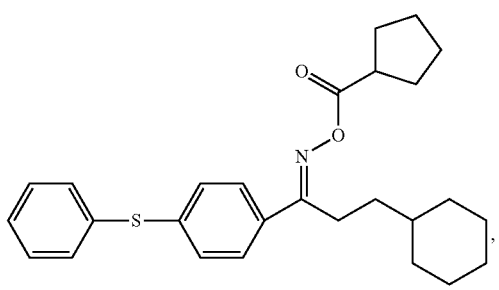
Compound No.16
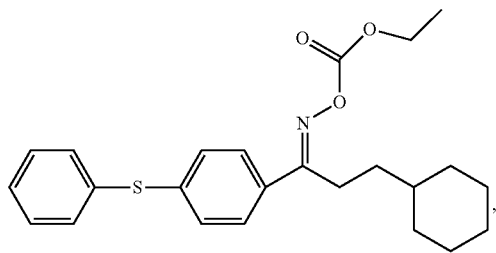
Compound No.17
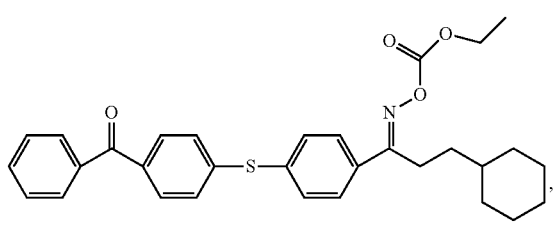
Compound No.18
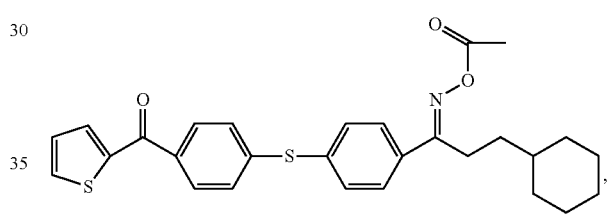
Compound No.19
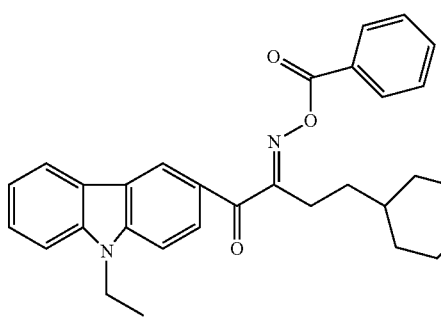
Compound No.20
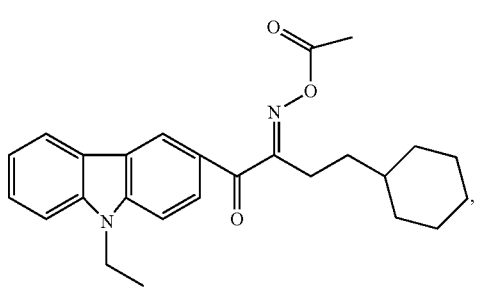

Compound No.21
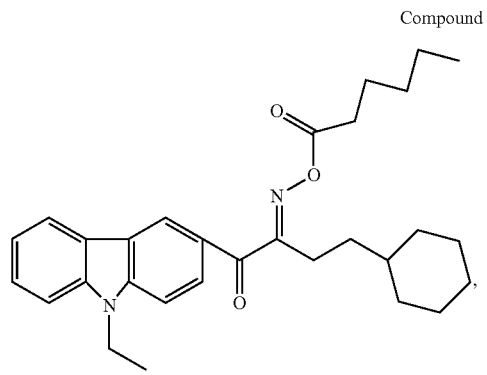
Compound No.22
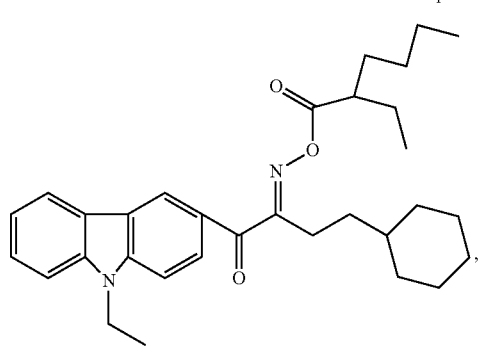
Compound No.23
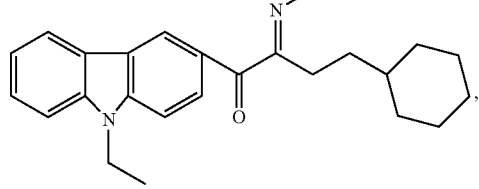
Compound No.24
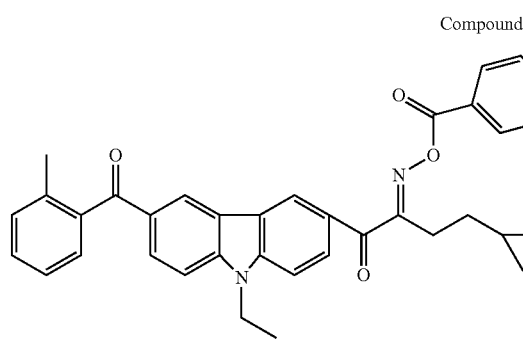
Compound No.25
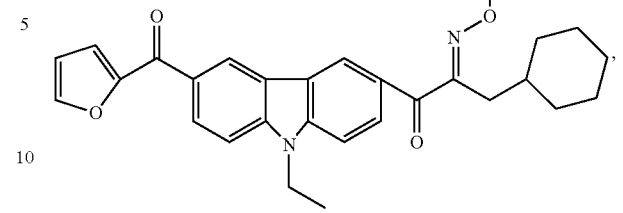
Compound No.26
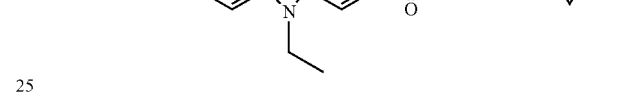
Compound No.27
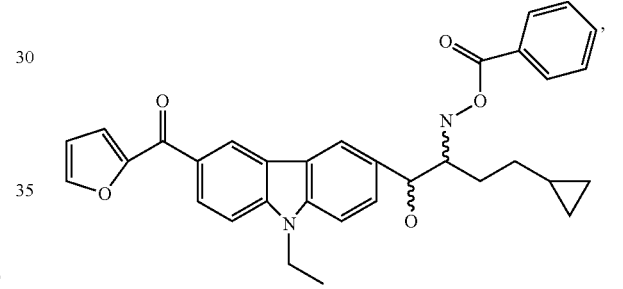
Compound No.28
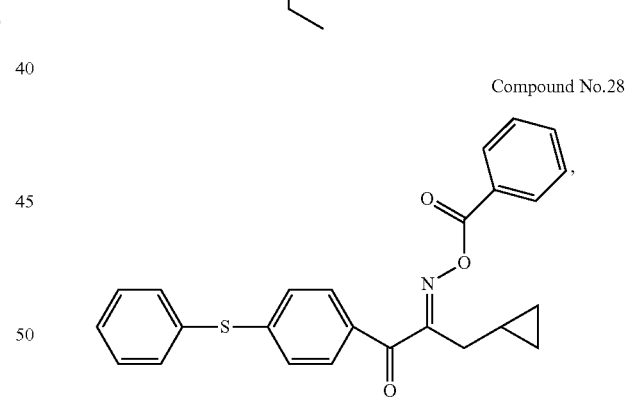
Compound No.29
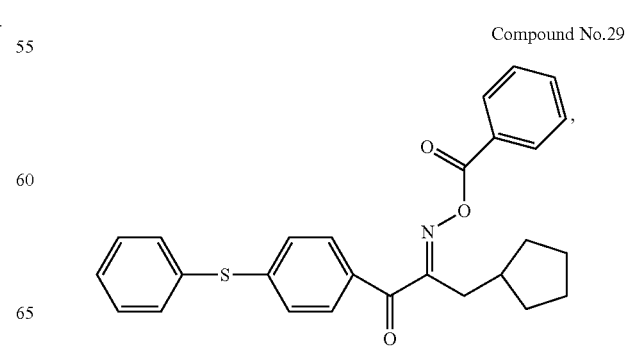

Compound No.30
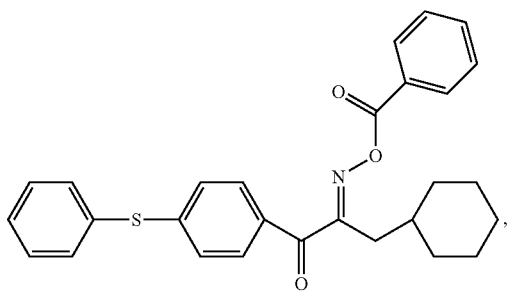
Compound No.31
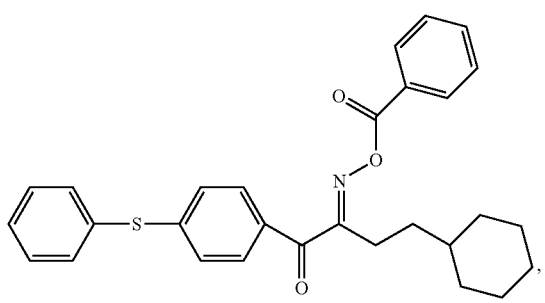
Compound No.32
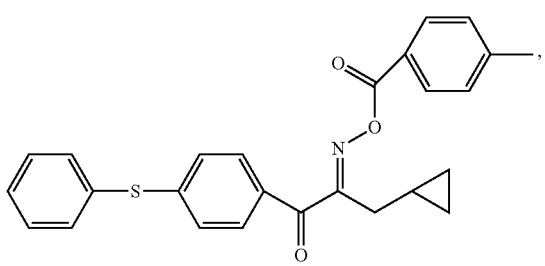
Compound No.33
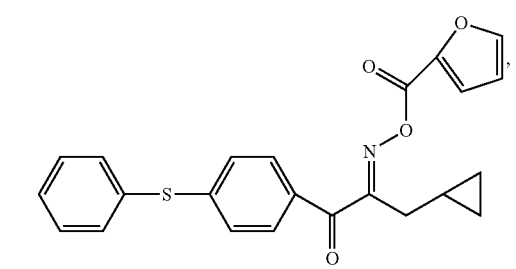
Compound No.34
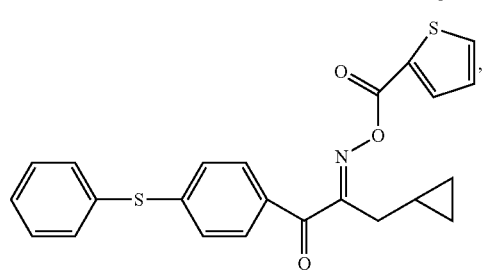
Compound No.35
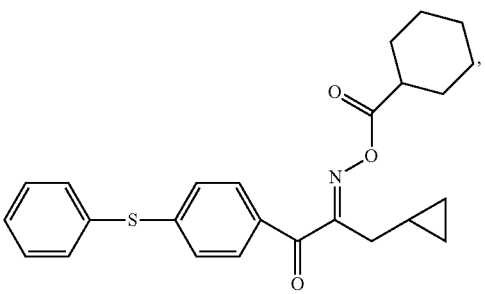
Compound No.36
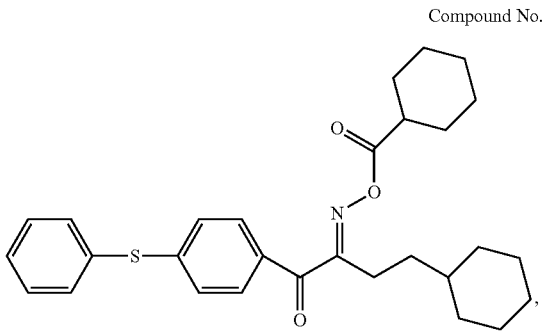
Compound No.37
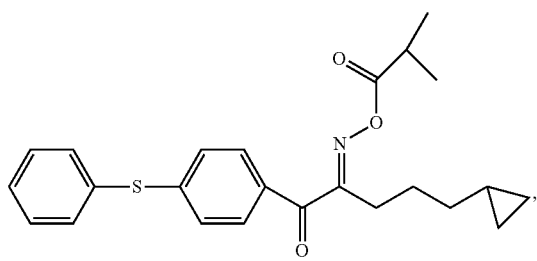
Compound No.38
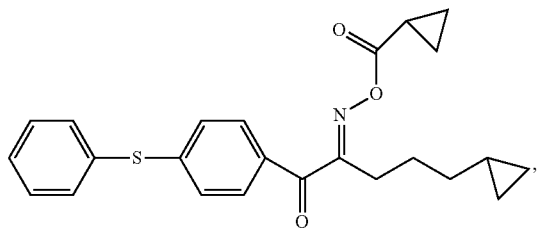
Compound No.39
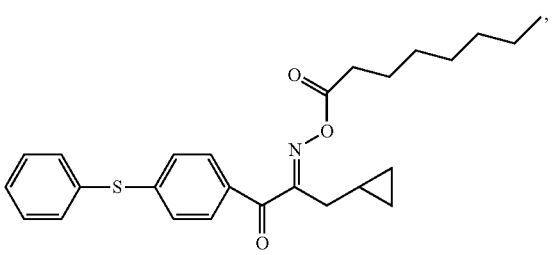

Compound No.40
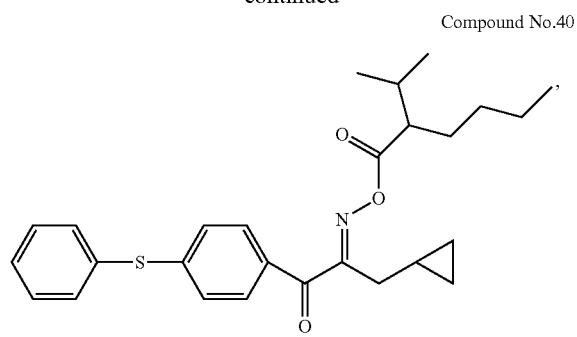
Compound No.41
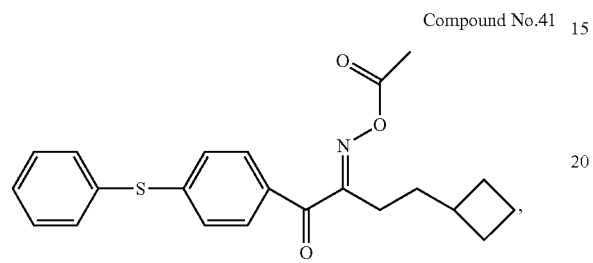
Compound No.42
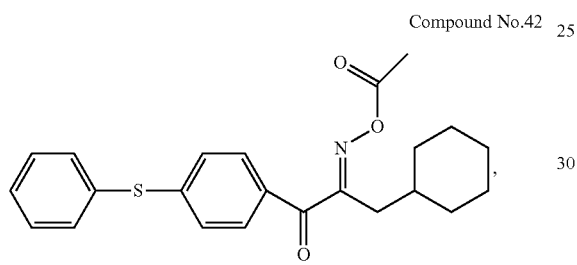
Compound No.43
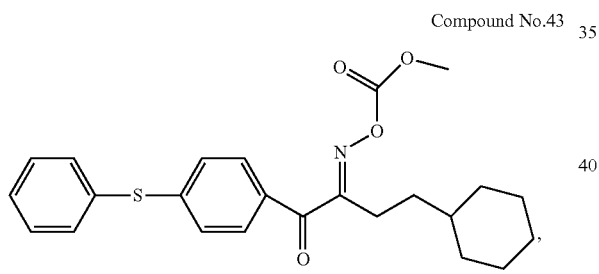
Compound No.44
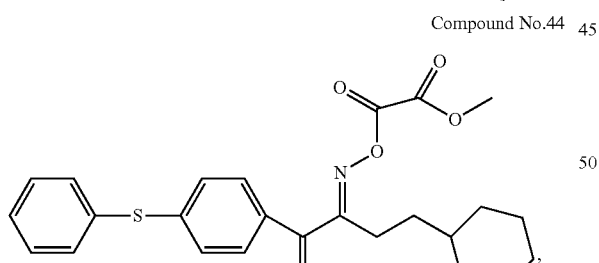
Compound No.45
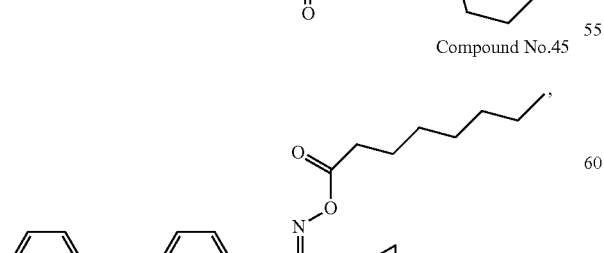
Compound No.46
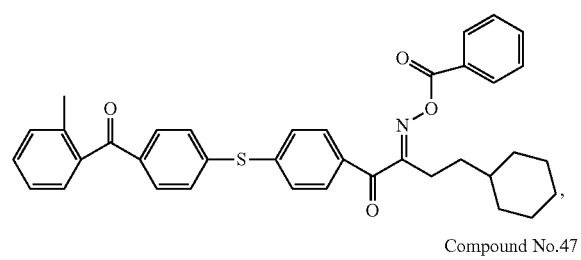
Compound No.47
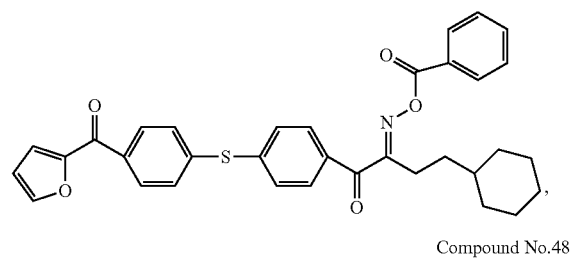
Compound No.48
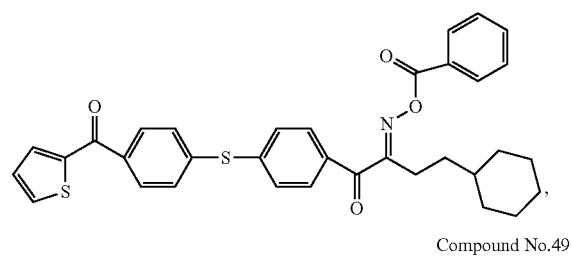
Compound No.49
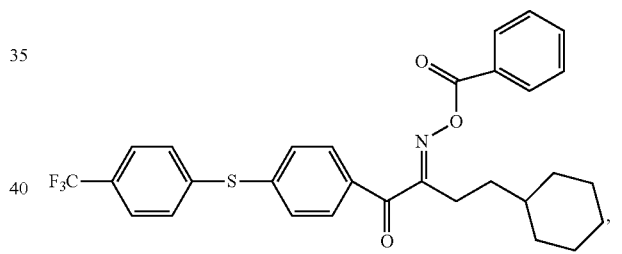
Compound No.50
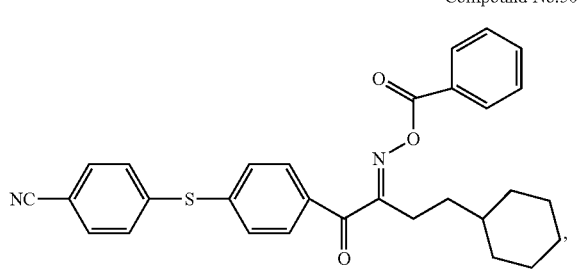
Compound No.51
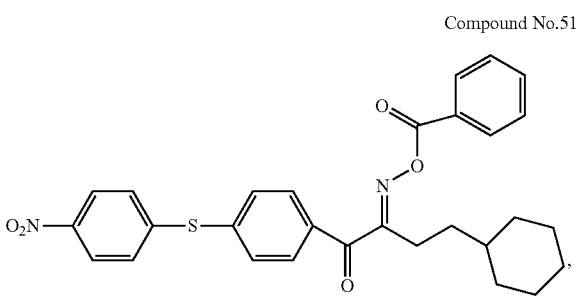

Compound No.52

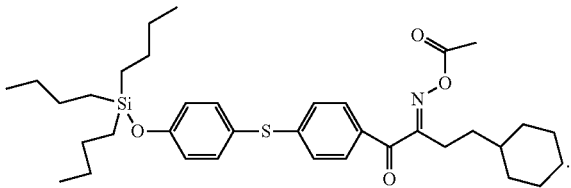

The polymer in component (A) is preferably selected from a copolymer comprising a benzyl (meth)acrylate monomer unit and a (meth)acrylic acid monomer unit, more preferably, a copolymer of benzyl methacrylate, methacrylic acid, and hydroxyethyl methacrylate and/or methyl methacrylate, and in the above copolymer, the molar ratio of benzyl methacrylate, methacrylic acid, and hydroxyethyl methacrylate and/or methyl methacrylate is 55-75:5-10:10-15. "Benzyl methacrylate, methacrylic acid, and hydroxyethyl methacrylate and/or methyl methacrylate" means that at least one of "hydroxyethyl methacrylate and/or methyl methacrylate" and the above mentioned "benzyl methacrylate" and "methacrylic acid" are used as the co-monomers together.

The polymer in component (A) is especially preferably a copolymer of benzyl methacrylate, methacrylic acid, hydroxyethyl methacrylate and/or methyl methacrylate, and an acrylate represented by the following formula (II):

formula (II)

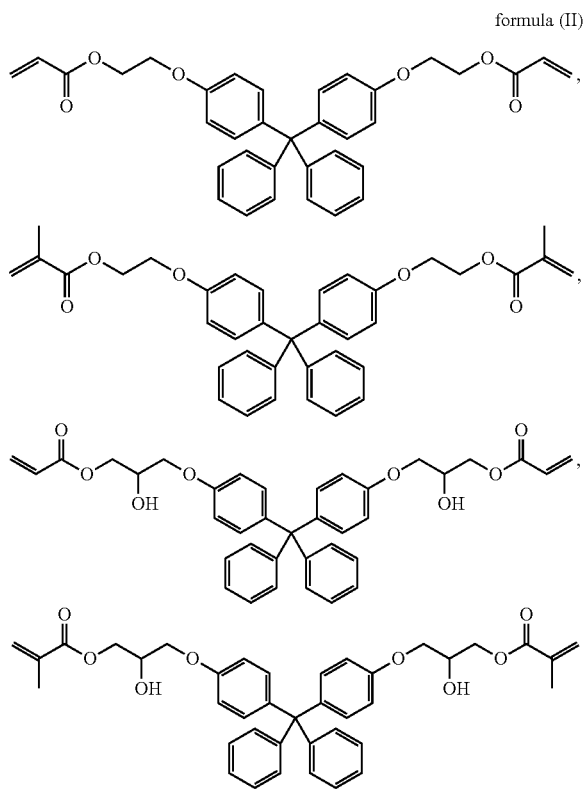

In the above copolymer, the molar ratio of benzyl methacrylate, methacrylic acid, hydroxyethyl methacrylate and/or methyl methacrylate and the acrylate represented by formula (II) is 55-60:5-10:10-15:10. The weight average molecular weight of the copolymer is 5000-250000.

As the component (A), the weight average molecular weight of the polymer is preferably 10000-50000; and the amount thereof in the acrylate composition is preferably 25-35 parts by mass.

In the photocurable acrylate composition of this disclosure, the polyfunctional acrylate monomer of component (B) may be exemplified by the following compounds: a di(meth)acrylate of an alkylene glycol such as ethylene glycol, propylene glycol, or the like; a di(meth) acrylate of a polyalkylene glycol such as polyethylene glycol, polypropylene glycol, or the like; a poly(meth) acrylate of a ternary or higher polyol such as glycerine, trimethylolpropane, pentaerythritol, dipentaerythritol or the like, or a dicarboxylic acid-modified derivative thereof; an oligo(meth) acrylate of polyesters, epoxy resins, urethane resins, alkyd resins, silicone resins, spirane resins, or the like; a di(meth)acrylate of a polymer whose both ends are hydroxyl-terminated, such as, both-hydroxyl-terminated poly-1,3-butadiene, both-hydroxyl-terminated polyisoprene, both-hydroxyl-terminated polycaprolactone, or the like; tris[2-(meth) acryloyloxyethyl] phosphate, or the like.

In the polyfunctional acrylate monomer described above, the poly(meth)acrylate of a ternary or higher polyol or a dicarboxylic acid-modified derivative thereof is preferred, and more preferably, trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

According to the needs of product applications, the photocurable acrylate composition of this disclosure may further selectively contain other auxiliaries commonly-used in photocurable compositions, including, but not limited to, a sensitizer, a colorant, a surfactant, or the like.

For example, a sensitizer, which exerts an auxiliary effect on the photocuring reaction, may be added. Exemplarily the sensitizer may be a coumarin derivative, a benzophenone derivative, a thioxanthone (TX) derivative, a pyrazoline derivative, or the like.

Also for example, a colorant may be added according to the needs of application systems. As for the colorant, it is not particularly limited and may be a dye and a pigment, preferably a pigment (including organic pigments and inorganic pigments), and may be appropriately selected according to the application of color filters or colored composition thin films obtained therefrom. In the acrylate composition of this disclosure, the colorant, if present, is contained preferably in an amount of 10-30 parts by mass, more preferably 15-20 parts by mass.

Furthermore, a surfactant (such as commercially available FC-4430) may be selectively added to facilitate the uniform dispersion of the composition systems (particularly in the process of performing film coating of the solution of the composition), which is well known to the person skilled in the art. When the acrylate composition contains this component, the surfactant is contained preferably in an amount of 0.01-1 parts by mass, more preferably 0.01-0.5 parts by mass.

Another object of this present disclosure is to provide a photoresist film and a color filter film produced from the photocurable acrylate composition described above.

In the photocurable acrylate composition described in this disclosure, the compound of formula (I) as a photoinitiator has a good adaptability to the selected components (A) and (B). By the combination of these components, the composition obtained has very good storage stability and remarkably high sensitivity at a short wavelength, may be cross-linked and cured at a very low exposure dose, and has an extremely good curing effect. The film made from the composition has a smooth edge, no defect and scum, and good integrity throughout the whole pattern, and is a high-hardness resist film, and an optical filter made therefrom has high optical transparency and no light leakage. In particular, when producing black matrices (BMs) in color filters, due to the presence of black pigment or dye, the utilization effect of light source is extremely poor, whereas the production of BMs still may be completed at a very low exposure dose by using this composition, and the BMs produced have high light-shielding property as well as excellent precision, evenness, and durability. Meanwhile, the composition of this disclosure is also an excellent material for producing photospacers.

DETAILED DESCRIPTION OF THE DISCLOSURE

Hereafter, this disclosure will be further illustrated by Examples, but it is not to be understood that the scope of this disclosure is limited thereto.

The techniques for producing RGBs, BMs, and photospacers using photocurable acrylate compositions by the processes of photocuring and lithography have been well known to the skilled person in the art, and typically comprise the steps of:

i) dissolving a photocurable composition in a suitable organic solvent (for example propylene glycol monomethyl ether acetate and/or ethyl 2-hydroxypropionate) to obtain a liquid-like composition;

ii) uniformly coating the liquid-like composition on a substrate using a coater, for example a spin coater, a wire bar coater, a roll coater, a spray coater, etc., iii) performing prebaking for drying to remove the solvent;

iv) attaching a mask plate onto a sample to perform exposure, and subsequently developing to remove the unexposed regions; and v) performing postbaking to obtain a dry photoresist film having a desirable shape.

The photoresist film containing a black pigment is exactly the black matrix, BM, and the photoresist films having red, green, blue pigments are exactly R, G, and B photoresists, respectively.

Photocurable Composition

Photocurable compositions were prepared by mixing with the formulations shown in Table 1, wherein each of the numeric values represents parts by mass.

TABLE 1

Type and parts by mass of components in photocurable compositions

| | Benzyl methacrylate/methacrylic acid/methyl methacrylate (molar ratio: 50/15/30) copolymer (Mw: 15000) (parts by mass) | Dipentaerythritol hexaacrylate (parts by mass) | Photoinitiator (type, parts by mass) | Pigment (type, parts by mass) |
|---|---|---|---|---|
| Example 1 | 50 | 25 | Compound No. 3, 5 | Carbon black, 20 |
| Example 2 | 55 | 20 | Compound No. 5, 5 | Carbon black, 20 |
| Example 3 | 40 | 20 | Compound No. 20, 5 | C.I. pigment red 254, 20 |
| Example 4 | 35 | 30 | Compound No. 30, 5 | C.I. pigment blue-15:3, 20 |
| Example 5 | 30 | 15 | Compound No. 17, 5 | C.I. pigment blue-15:3, 15 |
| Example 6 | 40 | 20 | Compound No. 24, 3 | C.I. pigment blue-15:3, 15 |
| Example 7 | 40 | 25 | Compound No. 32, 4 | C.I. pigment blue-15:3, 25 |
| Example 8 | 40 | 25 | Compound No. 48, 6 | C.I. pigment blue-15:3, 25 |
| Comparative Example 1 | 50 | 25 | 2-phenyl-2-dimethylamino-1-(-4-morpholinophenyl)-butanone-1 (Irgacure369), 5 | Carbon black, 20 |
| Comparative Example 2 | 30 | 45 | 1-(4-phenylthiophenyl)-(3-cyclopentyl propane)-1,2-dione-2-oxime-benzoate (CN101565472A), 5 | C.I. pigment blue-15:3, 20 |
| Comparative Example 3 | 30 | 35 | 1-(6-o-methylbenzoyl-9-ethylcarbazol-3-yl)-(3-ethanone)-1-oxime acetate (OXE02), 5 | Carbon black, 20 |

A photocurable composition was formulated by mixing according to the formulation shown in Table 1, and was dissolved in 100 parts by mass of a solvent propylene glycol monomethyl ether acetate (PGMEA) to form a liquid-state composition.

The liquid-state composition was coated on a glass substrate using a spin coater, and the solvent was removed by drying at 90° C. for 5 min to form a coating film having a film thickness of 1.5 µm; and in order to obtain the coating film having the thickness described above, the coating process may be completed by one time or by multiple times.

The substrate on which the coating film was formed was cooled to room temperature, a mask plate was attached thereon, a long wavelength irradiation was achieved with a high pressure mercury lamp 1PCS light source through a FWHM color filter, and exposure was performed on the coating film through a gap of the mask plate under an ultraviolet having a wavelength of 370-420 nm.

Under a temperature of 25° C., a 1% aqueous NaOH solution was used for development, ultra-pure pure water was used for washing, and air drying was performed.

Finally, baking was performed in an oven at 220° C. for 30 min to obtain a pattern transferred with the mask plate.

Performance Evaluation

By the following methods, evaluations were performed on the storage stability and the exposure sensitivity of the composition of this disclosure as well as the developability and the pattern integrity of the pattern formed with the composition on the glass substrate, and the results are summarized in Table 2.

1. Evaluation Method for Storage Stability

After storing a liquid-state composition at room temperature for 1 month, the degree of precipitation of substances was visually evaluated according to the following criteria:

A: Precipitation was not observed;

B: Precipitation was slightly observed;

C: Significant precipitation was observed.

2. Evaluation Method for Exposure Sensitivity

The minimum exposure amount of the irradiated region having a residual film rate of 90% or more after development in the step of exposure was evaluated as the demand of exposure. Smaller exposure demand represents higher sensitivity.

3. Evaluation Method for Developability and Pattern Integrity

The pattern on the substrate was observed using a scanning electron microscope (SEM) to evaluate the developability and the pattern integrity.

The developability was evaluated according to the following criteria:

○: Residue was not observed in unexposed portions;

◎: A small amount of residue was observed in unexposed portions, but the residual amount is acceptable;

●: Significant residue was observed in unexposed portions.

The pattern integrity was evaluated according to the following criteria:

Δ: Pattern defects were not observed;

□: A few defects were observed in some portions of the pattern;

▲: A number of defects were significantly observed in the pattern.

TABLE 2

Results of performance evaluation

| | Storage stability | Demand of exposure (mJ/cm$^2$) | Developability | Pattern integrity |
|---|---|---|---|---|
| Example 1 | A | 85 | ○ | Δ |
| Example 2 | A | 80 | ○ | Δ |
| Example 3 | A | 55 | ○ | Δ |
| Example 4 | A | 70 | ○ | Δ |
| Example 5 | A | 50 | ○ | Δ |
| Example 6 | A | 80 | ○ | Δ |
| Example 7 | A | 75 | ○ | Δ |
| Example 8 | A | 50 | ○ | Δ |
| Comparative Example 1 | B | 280 | ● | ▲ |
| Comparative Example 2 | A | 180 | ◎ | Δ |
| Comparative Example 3 | A | 220 | ○ | □ |

From the results of Table 2, it can be seen that color filter photoresists produced from the compositions of Examples 1-8 have good developability and pattern integrity, but Comparative Examples 1-3 have significant deficiencies in these aspects. It is to be particularly noted that the exposure doses in Examples 1-8 are less than 100 mJ/cm$^2$, which is far lower than those of Comparative Examples 1-3, exhibiting extremely excellent photosensitivity.

In summary, the photocurable acrylate composition of this disclosure exhibits very excellent application performance and has a wide prospect for application.

What is claimed is:

1. A photocurable acrylate composition, comprising the following components of:

(A) 20-45 parts by mass of a polymer having a carboxylic acid group at a side chain, wherein the polymer is a copolymer comprising a benzyl (meth)acrylate monomer unit and a (meth)acrylic acid monomer unit, and has a weight average molecular weight (Mw) of 5000-250000;

(B) 10-30 parts by mass of a polyfunctional acrylate monomer;

(C) 2-7 parts by mass of a photoinitiator, which is

Compound No.1

Compound No.2
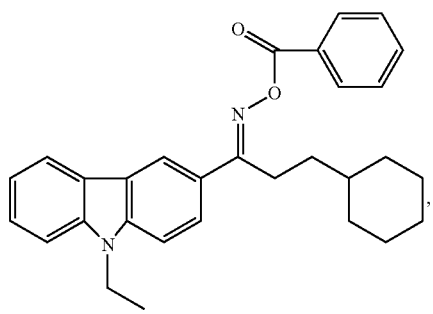
Compound No.3
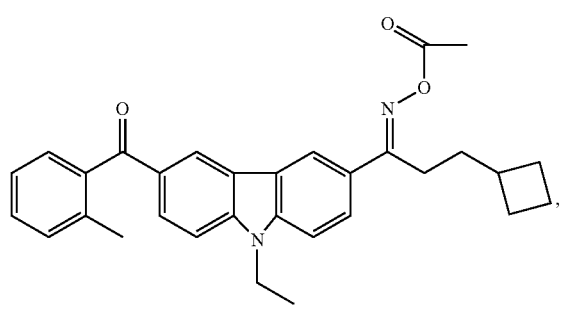
Compound No.4
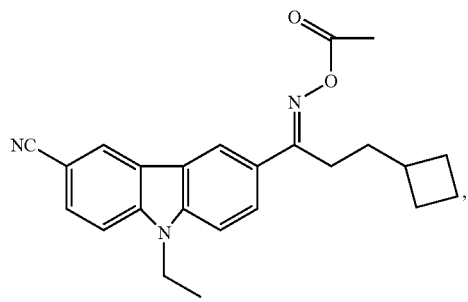
Compound No.5
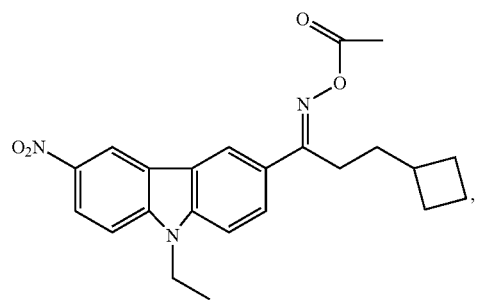
Compound No.6
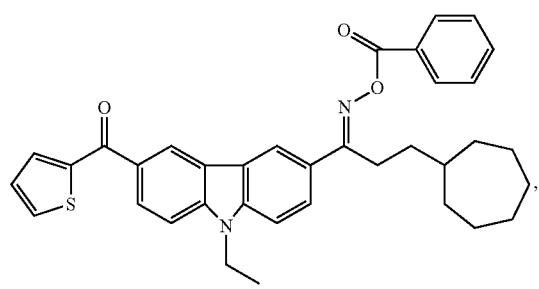
Compound No.7
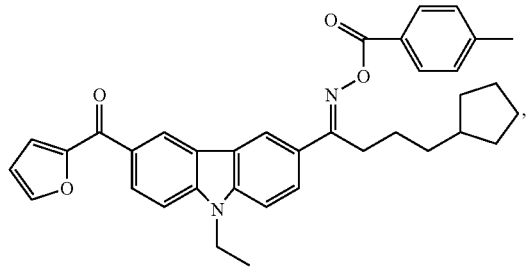
Compound No.8
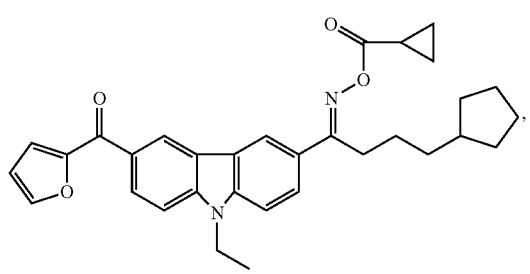
Compound No.9
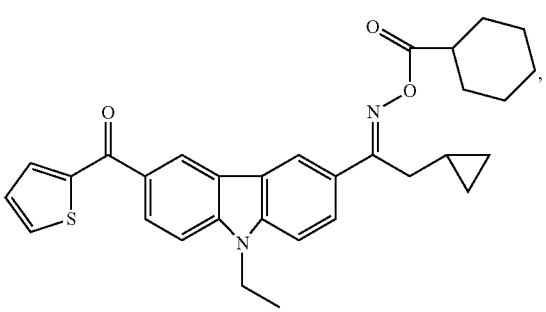
Compound No.19
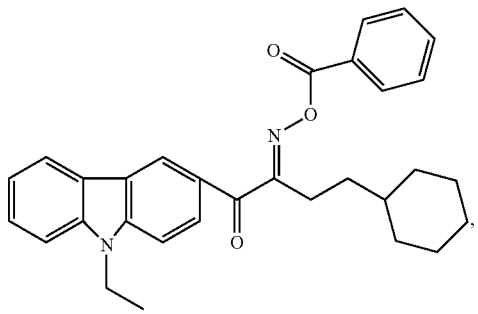
Compound No.20
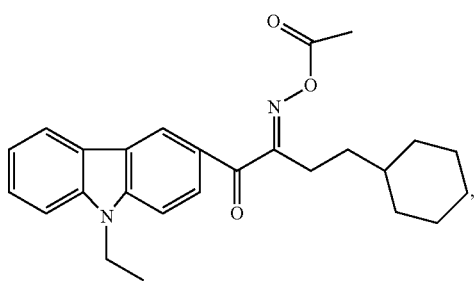

Compound No. 21
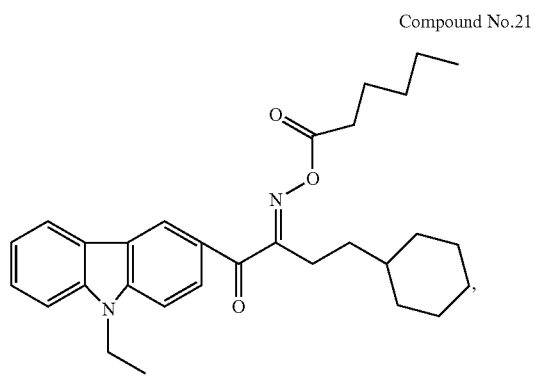

Compound No. 22
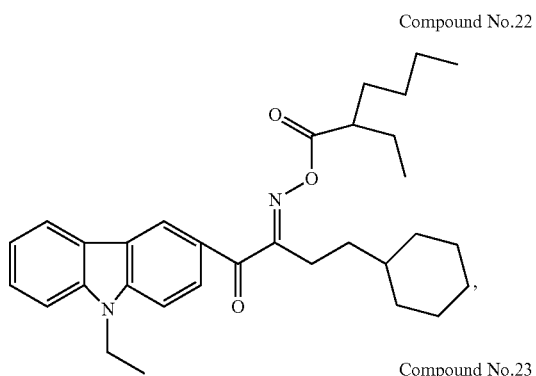

Compound No. 23
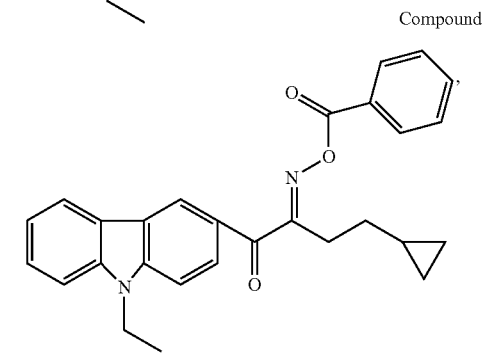

Compound No. 24
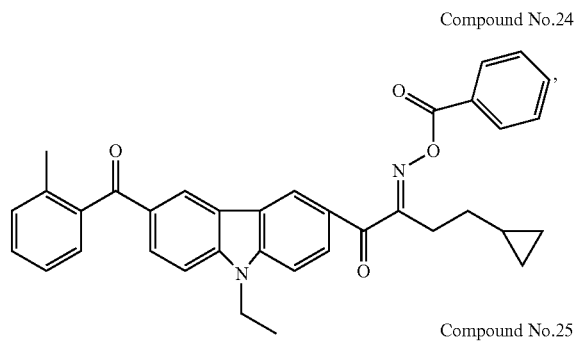

Compound No. 25
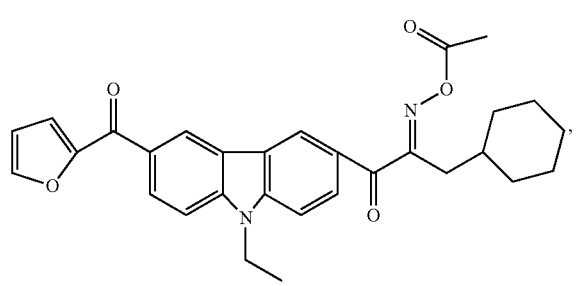

Compound No. 26
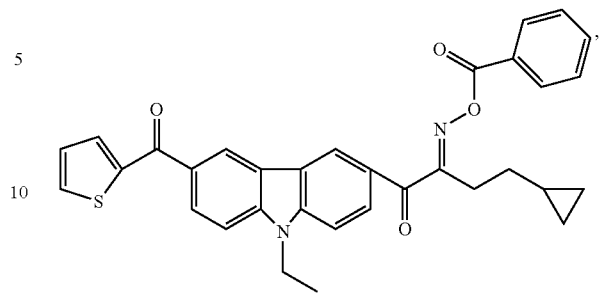

Compound No. 27
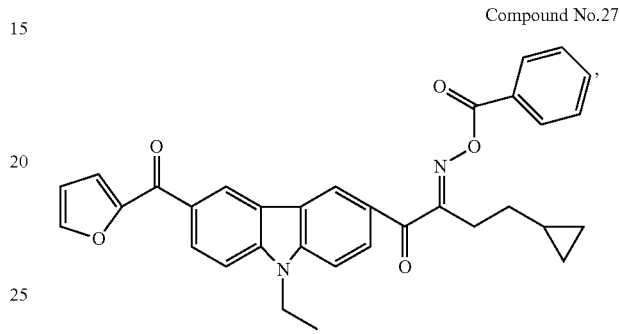

or a combination thereof.

2. The photocurable acrylate composition according to claim 1, wherein the polymer in component (A) is a copolymer of benzyl methacrylate, methacrylic acid, and hydroxyethyl methacrylate and/or methyl methacrylate, wherein the molar ratio of benzyl methacrylate, methacrylic acid, and hydroxyethyl methacrylate and/or methyl methacrylate is 55-75:5-10:10-15.

3. The photocurable acrylate composition according to claim 1, wherein the polymer in component (A) is a copolymer of benzyl methacrylate, methacrylic acid, an acrylate represented by the following formula (II) and at least one of hydroxyethyl methacrylate and methyl methacrylate:

formula (II)
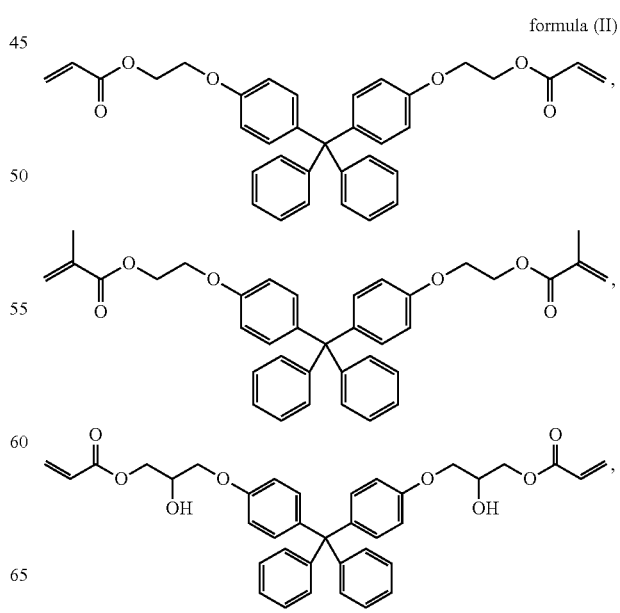

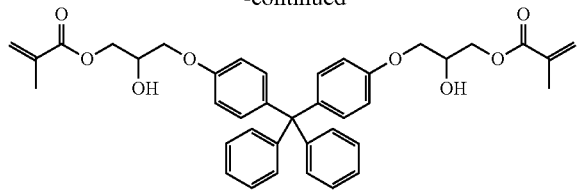

wherein the molar ratio of benzyl methacrylate, methacrylic acid, the acrylate represented by formula (II) and at least one of hydroxyethyl methacrylate and methyl methacrylate is 55-60:5-10:10-15:10.

4. The acrylate photocurable composition according to claim 1, wherein the polyfunctional acrylate monomer in component (B) is selected from a di(meth)acrylate of an alkylene glycol, a di(meth)acrylate of a polyalkylene glycol, a poly(meth)acrylate of a ternary or higher polyol or a dicarboxylic acid-modified derivative thereof, an oligo(meth)acrylate, a di(meth)acrylate of a polymer whose both ends are hydroxyl-terminated, and tris[2-(meth)acryloyloxyethyl] phosphate.

5. The photocurable acrylate composition according to claim 4, wherein the polyfunctional acrylate monomer is selected from trimethylolpropane triacrylate, trimethylolpropane trimethacrylate, pentaerythritol triacrylate, pentaerythritol trimethacrylate, pentaerythritol tetraacrylate, pentaerythritol tetramethacrylate, dipentaerythritol pentaacrylate, dipentaerythritol pentamethacrylate, dipentaerythritol hexaacrylate, and dipentaerythritol hexamethacrylate.

6. The photocurable acrylate composition according to claim 1, further comprising at least one of a sensitizer, a colorant and a surfactant.

7. A photospacer produced from the photocurable acrylate composition according to claim 1.

8. A color filter film produced from the photocurable acrylate composition according to claim 1.

* * * * *